United States Patent
Lubomirsky et al.

(10) Patent No.: US 7,341,633 B2
(45) Date of Patent: Mar. 11, 2008

(54) APPARATUS FOR ELECTROLESS DEPOSITION

(75) Inventors: Dmitry Lubomirsky, Cupertino, CA (US); Arulkumar Shanmugasundram, Sunnyvale, CA (US); Ian A. Pancham, San Francisco, CA (US); Sergey Lopatin, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 279 days.

(21) Appl. No.: 10/965,220

(22) Filed: Oct. 14, 2004

(65) Prior Publication Data
US 2005/0081785 A1 Apr. 21, 2005

Related U.S. Application Data

(60) Provisional application No. 60/511,236, filed on Oct. 15, 2003.

(51) Int. Cl.
  *B05C 3/09* (2006.01)
  *B05C 13/02* (2006.01)
(52) U.S. Cl. .................. 118/429; 118/423; 118/428; 118/719; 118/50; 134/84; 134/88; 134/902
(58) Field of Classification Search ............... 204/227, 204/232, 242, 275.1, 267, 269; 134/84, 88, 134/902; 118/410, 423, 428, 429, 50, 719; 414/217, 939; 156/345.31, 345.32
See application file for complete search history.

(56) References Cited

U.S. PATENT DOCUMENTS

| 2,369,620 | A | 2/1945 | Sullivan et al. |
| 3,937,857 | A | 2/1976 | Brummett et al. |
| 4,006,047 | A | 2/1977 | Brummett et al. |
| 4,232,060 | A | 11/1980 | Mallory et al. |
| 4,234,628 | A | 11/1980 | DuRose |
| 4,265,943 | A | 5/1981 | Goldstein et al. |

(Continued)

FOREIGN PATENT DOCUMENTS

EP 0 329 406 8/1989

(Continued)

OTHER PUBLICATIONS

Eze, F. C., "Electroless deposition of CoO thin films," J. Phys. D: Appl. Phys. 32 (1999), pp. 533-540.

(Continued)

*Primary Examiner*—Laura Edwards
(74) *Attorney, Agent, or Firm*—Patterson & Sheridan, LLP

(57) ABSTRACT

Embodiments of the invention generally provide a fluid processing platform. The platform includes a mainframe having a substrate transfer robot, at least one substrate cleaning cell on the mainframe, and at least one processing enclosure. The processing enclosure includes a gas supply positioned in fluid communication with an interior of the processing enclosure, a first fluid processing cell positioned in the enclosure, a first substrate head assembly positioned to support a substrate for processing in the first fluid processing cell, a second fluid processing cell positioned in the enclosure, a second head assembly positioned to support a substrate for processing in the second fluid processing cell, and a substrate shuttle positioned between the first and second fluid processing cells and being configured to transfer substrates between the fluid processing cells and the mainframe robot.

23 Claims, 9 Drawing Sheets

U.S. PATENT DOCUMENTS

| | | | |
|---|---|---|---|
| 4,364,803 A | 12/1982 | Nidola et al. | |
| 4,368,223 A | 1/1983 | Kobayashi et al. | |
| 4,397,812 A | 8/1983 | Mallory et al. | |
| 4,632,857 A | 12/1986 | Mallory, Jr. | |
| 4,810,520 A | 3/1989 | Wu | |
| 5,147,692 A | 9/1992 | Bengston | |
| 5,203,911 A | 4/1993 | Sricharoenchaikit et al. | |
| 5,235,139 A | 8/1993 | Bengston et al. | |
| 5,240,497 A | 8/1993 | Shacham et al. | |
| 5,248,527 A | 9/1993 | Uchida et al. | |
| 5,380,560 A | 1/1995 | Kaja et al. | |
| 5,384,284 A | 1/1995 | Doan et al. | |
| 5,415,890 A | 5/1995 | Kloiber et al. | |
| 5,478,462 A | 12/1995 | Walsh | |
| 5,510,216 A | 4/1996 | Calabrese et al. | |
| 5,648,125 A | 7/1997 | Cane | |
| 5,674,787 A | 10/1997 | Zhao et al. | |
| 5,695,810 A | 12/1997 | Dubin et al. | |
| 5,733,816 A | 3/1998 | Iyer et al. | |
| 5,755,859 A | 5/1998 | Brusic et al. | |
| 5,824,599 A | 10/1998 | Schacham-Diamond et al. | |
| 5,830,805 A | 11/1998 | Shacham-Diamand et al. | |
| 5,843,538 A | 12/1998 | Ehrsam et al. | |
| 5,844,195 A * | 12/1998 | Fairbairn et al. | 219/121.43 |
| 5,846,598 A | 12/1998 | Semkow et al. | |
| 5,885,749 A | 3/1999 | Huggins et al. | |
| 5,891,513 A | 4/1999 | Dubin et al. | |
| 5,904,827 A | 5/1999 | Reynolds | |
| 5,907,790 A | 5/1999 | Kellam | |
| 5,910,340 A | 6/1999 | Uchida et al. | |
| 5,913,147 A | 6/1999 | Dubin et al. | |
| 5,932,077 A | 8/1999 | Reynolds | |
| 5,933,757 A | 8/1999 | Yoshikawa et al. | |
| 5,969,422 A | 10/1999 | Ting et al. | |
| 6,010,962 A | 1/2000 | Liu et al. | |
| 6,015,724 A | 1/2000 | Yamazaki | |
| 6,015,747 A | 1/2000 | Lopatin et al. | |
| 6,065,424 A | 5/2000 | Schacham-Diamond et al. | |
| 6,077,780 A | 6/2000 | Dubin | |
| 6,107,199 A | 8/2000 | Allen et al. | |
| 6,110,530 A | 8/2000 | Chen et al. | |
| 6,113,771 A | 9/2000 | Landau et al. | |
| 6,136,163 A | 10/2000 | Cheung et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,153,935 A | 11/2000 | Edelstein et al. | |
| 6,165,912 A | 12/2000 | McConnell et al. | |
| 6,171,661 B1 | 1/2001 | Zheng et al. | |
| 6,174,812 B1 | 1/2001 | Hsiung et al. | |
| 6,180,523 B1 | 1/2001 | Lee et al. | |
| 6,197,181 B1 | 3/2001 | Chen | |
| 6,197,364 B1 | 3/2001 | Paunovic et al. | |
| 6,197,688 B1 | 3/2001 | Simpson | |
| 6,228,233 B1 | 5/2001 | Lakshmikanthan et al. | |
| 6,242,349 B1 | 6/2001 | Nogami et al. | |
| 6,245,670 B1 | 6/2001 | Cheung et al. | |
| 6,251,236 B1 | 6/2001 | Stevens | |
| 6,258,220 B1 | 7/2001 | Dordi et al. | |
| 6,258,223 B1 | 7/2001 | Cheung et al. | |
| 6,258,270 B1 | 7/2001 | Hilgendorff et al. | |
| 6,261,637 B1 | 7/2001 | Oberle | |
| 6,267,853 B1 * | 7/2001 | Dordi et al. | 204/232 |
| 6,291,348 B1 | 9/2001 | Lopatin et al. | |
| 6,319,387 B1 | 11/2001 | Krishnamoorthy et al. | |
| 6,323,128 B1 | 11/2001 | Sambucetti et al. | |
| 6,342,733 B1 | 1/2002 | Hu et al. | |
| 6,344,410 B1 | 2/2002 | Lopatin et al. | |
| 6,416,647 B1 | 7/2002 | Dordi et al. | |
| 6,432,819 B1 | 8/2002 | Pavate et al. | |
| 6,436,267 B1 | 8/2002 | Carl et al. | |
| 6,436,816 B1 | 8/2002 | Lee et al. | |
| 6,441,492 B1 | 8/2002 | Cunningham | |
| 6,488,984 B1 | 12/2002 | Wada et al. | |
| 6,516,815 B1 | 2/2003 | Stevens et al. | |
| 6,528,409 B1 | 3/2003 | Lopatin et al. | |
| 6,565,729 B2 | 5/2003 | Chen et al. | |
| 6,573,606 B2 | 6/2003 | Sambucetti et al. | |
| 6,605,874 B2 | 8/2003 | Leu et al. | |
| 6,616,967 B1 | 9/2003 | Test | |
| 6,645,550 B1 | 11/2003 | Cheung et al. | |
| 6,699,380 B1 * | 3/2004 | Chen et al. | 205/205 |
| 6,717,189 B2 | 4/2004 | Inoue et al. | |
| 6,743,473 B1 | 6/2004 | Parkhe et al. | |
| 2001/0030366 A1 | 10/2001 | Nakano et al. | |
| 2002/0036143 A1 | 3/2002 | Segawa et al. | |
| 2002/0098681 A1 | 7/2002 | Hu et al. | |
| 2003/0010645 A1 | 1/2003 | Ting et al. | |
| 2003/0075808 A1 | 4/2003 | Inoue et al. | |
| 2003/0116439 A1 | 6/2003 | Seo et al. | |
| 2003/0181040 A1 | 9/2003 | Ivanov et al. | |
| 2003/0190426 A1 | 10/2003 | Padhi et al. | |
| 2004/0137161 A1 | 7/2004 | Segawa et al. | |
| 2004/0154535 A1 | 8/2004 | Chen et al. | |

FOREIGN PATENT DOCUMENTS

| | | |
|---|---|---|
| EP | 0 475 567 | 3/1992 |
| EP | 0 913 498 | 5/1999 |
| EP | 1 496 542 A2 | 1/2005 |
| GB | 2285174 | 6/1995 |
| JP | 7-297543 | 11/1995 |
| JP | 11-124682 | 5/1999 |
| WO | WO 99/54920 | 10/1999 |
| WO | WO 02/083981 A1 | 10/2002 |
| WO | WO 03/014416 A2 | 2/2003 |
| WO | WO 2005/036615 A2 | 4/2005 |

OTHER PUBLICATIONS

Eze, et al., "Chemical-bath-deposited cobalt sulphide films: preparation effects," Materials Chemistry and Physics, 47 (1997), pp. 31-36.

Lopatin, et al., "Thin Electroless barrier for copper films", Part of the SPIE Conference of Multilevel Interconnect technology II, SPIE vol. 3508 (1998), pp. 65-77.

Pearlstein, Fred. "Electroless Plating," J. Res. Natl. Bur. Stan., Ch. 31 (1963), pp. 710-747.

The Chinese Journal of Nonferrous Metals, vol. 10, No. 1, Feb. 2, 2000, Abstract included.

Shacham-Diamond, et al., "Electrochemically deposited thin film alloys for ULSI and MEMS applications," Microelectronic Engineering 50 (2000), pp. 525-531.

Saito, et al., "Electroless deposition of Ni-B, Co-B and Ni-Co-B alloys using dimethylamineborane as a reducing agent," Journal of Applied Electrochemistry 28 (1998), pp. 559-563.

Schacham-Diamond, et al. "Material properties of electroless 100-200 nm thick CoWP films," Electrochemical Society Proceedings, vol. 99-34, pp. 102-110, undated.

Yosi Shacham-Diamond, et al. "High Aspect Ratio Quarter-Micron Electroless Copper Integrated Technology", Microelectronic Engineering 37/38 (1997) pp. 77-88.

C.K. Hu, et al. "Reduced Electromigration of Cu Wires by Surface Coating" Applied Physics Letters, vol. 81, No. 10, Sep. 2, 2002—pp. 1782-1784.

Lin, et al., "Manufacturing of Cu Electroless Nickel/Sn-Pb Flip Chip Solder Bumps", IEEE Transactions on Advanced Packaging, vol. 22, No. 4 (Nov. 1999), pp. 575-579.

* cited by examiner

APPARATUS FOR ELECTROLESS DEPOSITION

CROSS-REFERENCE TO RELATED APPLICATIONS

This application claims benefit of U.S. provisional patent application Ser. No. 60/511,236, filed Oct. 15, 2003, which is herein incorporated by reference.

BACKGROUND OF THE INVENTION

1. Field of the Invention

Embodiments of the invention generally relate to a processing platform for conducting an electroless deposition process.

2. Description of the Related Art

Metallization of sub 100 nanometer sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 10:1, interconnect features with a conductive material, such as copper. Conventionally, deposition techniques such as chemical vapor deposition and physical vapor deposition have been used to fill interconnect features. However, as the interconnect sizes decrease and aspect ratios increase, void-free interconnect fill via conventional metallization techniques becomes increasingly difficult. As a result, plating techniques, i.e., electrochemical plating and electroless deposition, have emerged as promising processes for void free filling of sub 100 nanometer sized high aspect ratio interconnect features in integrated circuit manufacturing processes. Further, plating processes, and in particular, electroless deposition processes have emerged as promising processes for depositing post deposition layers, such as capping layers.

However, with regard to electroless deposition processes, conventional processing apparatuses and methods have faced challenges in accurately controlling the electroless deposition process and the defect ratios in the resulting deposition layers. Further, a functional integrated platform for an electroless deposition process capable of pre and post deposition cleaning of substrates, depositing uniform electroless layers with minimal defects, and annealing the substrates is needed.

SUMMARY OF THE INVENTION

Embodiments of the invention generally provide an electroless substrate processing platform. The platform generally includes a substrate interface section, generally termed a factory interface, and a mainframe processing section. The substrate interface section generally operates to deliver substrates into and remove substrates from the processing mainframe, where the deposition process is conducted. The mainframe generally includes a bevel clean cell, a substrate rinse and dry cell, which may be combined with the bevel clean cell, and an electroless deposition assembly, all of which are accessible by a mainframe robot. Further, an annealing station may be positioned in communication with the mainframe or in communication with the substrate interface section.

Embodiments of the invention generally provide a fluid processing platform. The fluid processing platform includes a mainframe having substrate transfer robot, at least one substrate cleaning cell positioned on the mainframe, and at least one processing enclosure containing an electroless deposition assembly. The processing enclosure includes a gas supply assembly positioned in fluid communication with an interior of the processing enclosure, a first fluid processing cell positioned in the enclosure, a first substrate head assembly positioned to support a substrate for processing in the first fluid processing cell, a second fluid processing cell positioned in the enclosure, a second head assembly positioned to support a substrate for processing in the second fluid processing cell, and a substrate shuttle positioned between the first and second fluid processing cells and being configured to transfer substrates between the fluid processing cells and the mainframe robot.

Embodiments of the invention may further provide a method for depositing a metal onto a substrate. The method generally includes positioning the substrate on a shuttle positioned in a deposition enclosure, flowing an inert gas into the deposition enclosure to provide an oxygen content in the enclosure of less than about 100 ppm, transferring the substrate with the shuttle to a first fluid processing cell for an activation process, and transferring the substrate with the shuttle to a second fluid processing cell for an electroless deposition process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide an integrated electroless deposition system or platform. The platform generally includes a factory interface (FI) and a mainframe processing section positioned in communication with the FI. The mainframe processing section generally includes a substrate cleaning cell, an electroless deposition assembly, and a robot configured to access cleaning cell and the processing cells in the electroless deposition assembly. An annealing station may be positioned in communication with the mainframe or in communication with the substrate interface section to anneal substrates once the deposition and/or cleaning processes are completed, or alternatively, before the deposition process, if desired.

Figure 1:
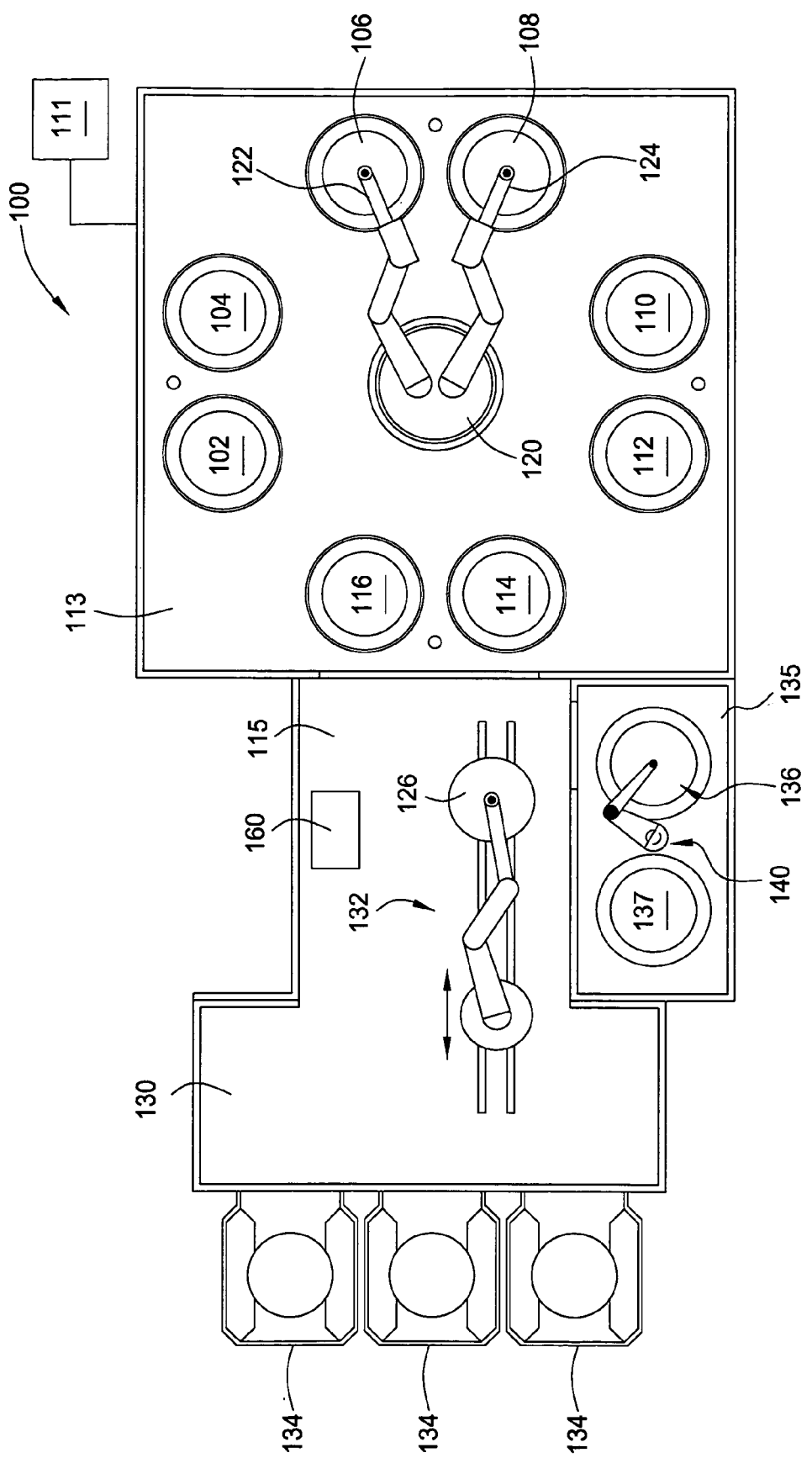
FIG. 1 illustrates a plan view of one embodiment of an electroless deposition system of the invention.

FIG. 1 illustrates a top plan view of an exemplary processing system 100 of the invention. System 100 includes FI 130, which has a plurality of substrate loading stations 134 configured to interface with substrate containing cassettes. A robot 132 is positioned in FI 130 and is configured to access substrates contained in cassettes positioned on the loading stations 134. Further, robot 132 also extends into a link tunnel 115 that connects the FI 130 to a processing mainframe 113. The position of robot 132 allows for access to loading stations 134 to retrieve substrates therefrom and then deliver the substrates to one of the processing locations 114, 116 positioned on the processing mainframe 113, or alternatively, to the annealing station 135. Similarly, robot 132 may be used to retrieve substrates from the processing location 114, 116 or the annealing station 135 after a substrate processing sequence is complete. In this situation robot 132 may deliver the substrate back to one of the cassettes positioned on the loading stations 134 for removal from system 100. The FI 130 may also include a metrology/inspection station 160, which may be used to inspect substrates before and/or after a processing step. The metrology/inspection station may be used, for example, to analyze the characteristics, e.g., thickness, planarity, grain structure, etc., of plated materials on the substrate. The metrology information may be communicated to subsequent process hardware for use in controlling subsequent processes conducted on the substrate, or alternatively, the metrology information may be used to control subsequent processing steps in the processing cell the measured substrate came from. Exemplary metrology/inspection stations that may be used in embodiments of the invention include the BX-30 Advanced Interconnect Measurement System system, and CD-SEM or DR-SEM inspection stations, all of which are commercially available from Applied Materials, Inc. of Santa Clara, Calif.

The anneal station 135 generally includes a two position annealing station, wherein a cooling plate 136 and a heating plate 137 are positioned adjacent to one another with a substrate transfer robot 140 positioned proximate thereto, e.g., between the two stations. The robot 140 is configured to move substrates between the respective heating 137 and cooling plates 136. Further, although the anneal station 135 is illustrated as being positioned such that it is accessed from the link tunnel 115, embodiments of the invention are not limited to any particular configuration or placement. As such, the anneal station 135 may be positioned in direct communication with the processing mainframe 113, i.e., accessed by mainframe robot 120, or alternatively, the annealing station 135 may be positioned in communication with the processing mainframe 113, i.e., the annealing station may be positioned on the same system as processing mainframe 113, but may not be in direct contact with the processing mainframe 113 or accessible from the mainframe robot 120. For example, as illustrated in FIG. 1, the anneal station 135 may be positioned in direct communication with the link tunnel 115, which allows for access to the processing mainframe 113, and as such, the anneal chamber 135 is illustrated as being in communication with the processing mainframe 113. Additional description of the anneal station 135 may be found in commonly assigned U.S. patent application Ser. No. 60/463,860 entitled "Two Position Anneal Chamber" and filed on Apr. 18, 2003, which is hereby incorporated by reference in its entirety.

The processing mainframe 113 includes a centrally positioned substrate transfer robot 120. The centrally positioned substrate transfer robot 120 generally includes one or more arms/blades 122, 124 configured to support and transfer substrates between various positions on the processing mainframe 113 and adjacent processing locations. Additionally, robot 120 and the accompanying blades 122, 124 are generally configured to extend, rotate, pivot about a joint (horizontally move), and vertically move so that the robot 120 may insert and remove substrates to/from a plurality of processing locations 102, 104, 106, 108, 110, 112, 114, 116 positioned on processing mainframe 113. The blades 122, 124 of robot 120 may act cooperatively, i.e., they may transfer substrates simultaneously from adjacent processing locations, or alternatively, the blades may operate independently, i.e., each blade may be accessing different processing locations on different sides of the mainframe at the same time. Similarly, factory interface robot 132 also includes the ability to rotate, extend, pivot, and vertically move its substrate support blade, while also allowing for linear travel along the robot track 150 that extends from the factory interface 130 to the processing mainframe 113. Generally, processing locations 102, 104, 106, 108, 110, 112, 114, 116 may include any number of processing cells utilized in a substrate processing system. More particularly, the process cells may be configured as electrochemical plating cells, rinsing cells, bevel clean cells, spin rinse dry cells, substrate surface cleaning cells (which collectively includes cleaning, rinsing, and etching cells), electroless deposition cells (which includes pre and post clean cells, rinsing cells, activation cells, deposition cells, etc.), metrology inspection stations, and/or other processing cells that may be beneficially used in conjunction with a deposition platform. Each of the respective processing cells and robots are generally in communication with a process controller 111, which may be a microprocessor-based control system configured to receive inputs from both a user and/or various sensors positioned on the system 100, and appropriately control the operation of system 100 in accordance with the inputs. Additionally, the process cells are also in communication with a fluid delivery system configured to supply the necessary processing fluids to each of the respective cells during processing. An exemplary processing fluid delivery system may be found in commonly assigned U.S. patent application Ser. No. 10/438, 624 entitled "Multi-Chemistry Electrochemical Processing System", filed on May 14, 2003, which is hereby incorporated by reference in its entirety.

In the exemplary electroless deposition system illustrated in FIG. 1, the processing locations may be configured as follows. Processing locations 114 and 116 may be configured as an interface between the wet processing stations on the processing mainframe 113 and the generally dry processing regions in the link tunnel 115, annealing station 135, and the FI 130. The processing cells located at the interface cells may be spin rinse dry cells and/or substrate cleaning cells, for example. More particularly, each of locations 114 and 116 may include both a spin rinse dry cell and a substrate cleaning cell in a stacked configuration. A detailed description of an exemplary spin rinse dry cell that may be used in embodiments of the invention may be found in commonly assigned U.S. patent application Ser. No. 60/463,862, entitled "Spin Rinse Dry Cell", filed on Apr. 18, 2003, which is hereby incorporated by reference in its entirety.

Processing locations 106, 108 may be configured as bevel cleaning cells, i.e., cells configured to remove excess deposition from the perimeter of a substrate after a deposition process has been completed. An exemplary bevel cleaning cell may be found in commonly assigned U.S. patent application Ser. No. 60/463,970, entitled "Integrated Bevel Clean Chamber", filed on Apr. 18, 2003, which is hereby incorporated by reference in its entirety.

Processing locations 102, 104, 110, and 112 may be configured as plating or plating support cells, e.g., electrochemical plating cells, electroless deposition cells, activation cells, and/or substrate rinse or clean cells, for example. In the embodiment where the processing cells are electroless deposition cells, generally one cell per side of the platform 100 will be an activation cell and the other cell on the same side of the platform will be an electroless deposition cell. This configuration will generally be mirrored on the opposing side of the platform 100. For example, processing locations 102 and 112 may be configured as activation cells (which will be further discussed herein), while processing locations 104 and 110 may be configured as electroless deposition cells (which will also be further discussed herein). In this embodiment, substrate being processed will generally be positioned in the activation cell location 102, 112 by the mainframe robot 120, where a surface activating solution is dispensed thereon. Thereafter, the substrate may be rinsed or cleaned at processing cell locations 114, 116 and then transferred to the electroless deposition cell location 104, 110 by the mainframe robot 120, where an electroless deposition solution is dispensed onto the activated and cleaned surface. Alternatively, the substrate may be rinsed at one of processing cell locations 102, 104, 110, 112. Thereafter, the substrate may be cleaned and/or rinsed at one or more of processing cell locations 114, 116, 122, 124, or in the activation cell location 102, 112.

In the embodiment illustrated in FIG. 1, the mainframe robot 120 is used to position substrates in the respective processing cell locations 110, 112, 102, 104 for processing. The respective processing cell locations may include a substrate support assembly configured to support the substrate for processing in the respective cell, and as such, the robot 120 may be used to hand the substrate off to the substrate support for the respective cell, and further, robot 120 may be used to transfer the substrate from one cell to another for a subsequent processing step. An exemplary substrate support member or head assembly that may be used in this embodiment is further described herein with respect to FIGS. 2-7. In this embodiment, the substrate is supported for processing in a face down configuration, and as such, handoff of the substrate from the mainframe robot 120 to the substrate support will generally require a intermediate support step if the mainframe robot 120 not to contact the production surface of the substrate. In embodiments where the substrate is supported in a face up configuration for processing, the mainframe robot 120 may position the substrate in the respective cell for processing and retract. Exemplary processing cells that may be used may be found in commonly assigned U.S. Pat. No. 6,258,223, entitled "In-Situ Electroless Copper Seed Layer Enhancement in an Electroplating System", issued on Jul. 10, 2001 and commonly assigned U.S. patent application Ser. No. 10/036,321, entitled "Electroless Plating System", filed on Dec. 26, 2001, now U.S. Pat. No. 6,824,612 both of which are hereby incorporated by reference in their entirety.

Figure 2:
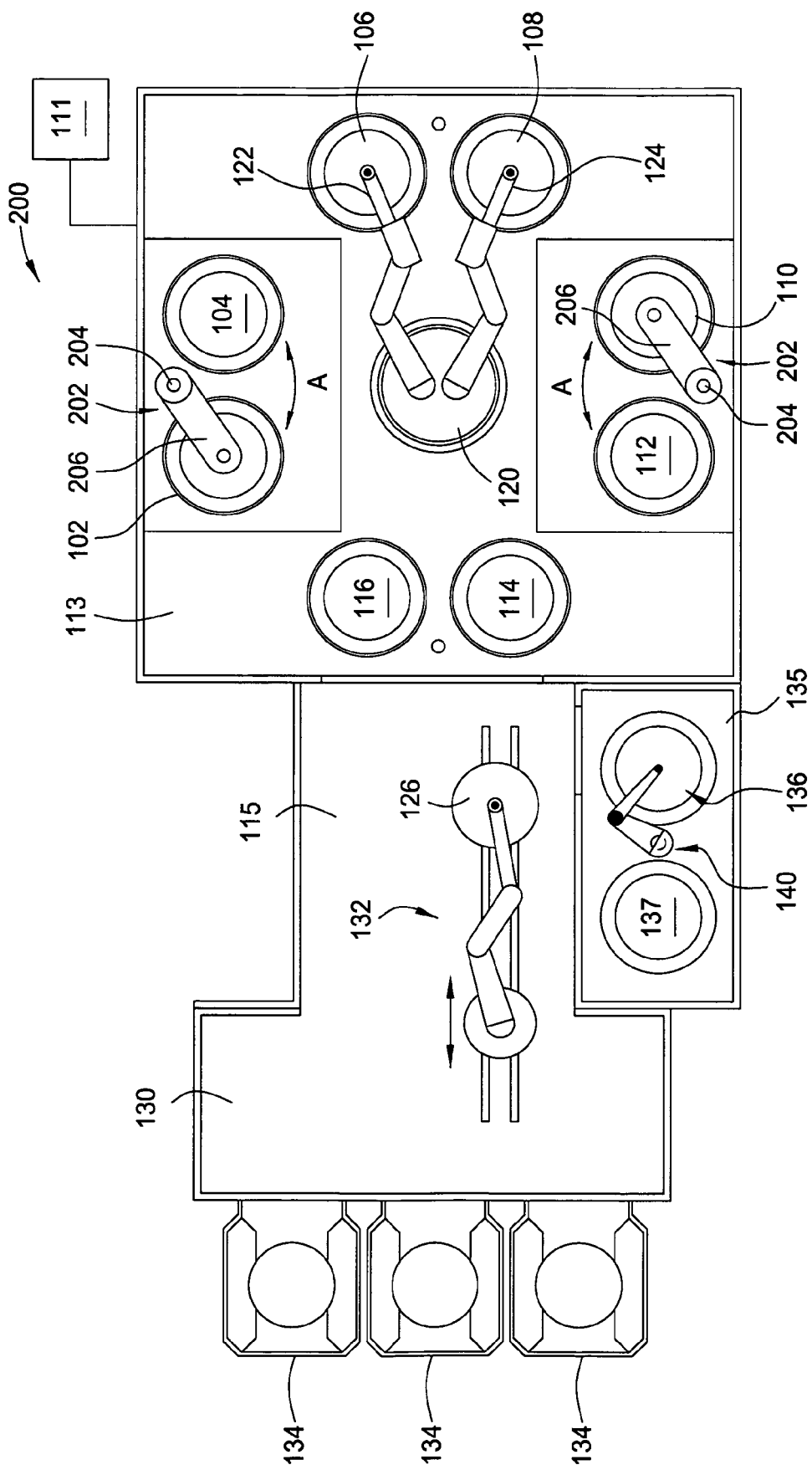
FIG. 2 illustrates a plan view of another embodiment of an electroless deposition platform of the invention.

FIG. 2 illustrates another embodiment of an electroless deposition platform 200 of the invention. The embodiment illustrated in FIG. 2 is generally similar to the embodiment illustrated in FIG. 1, and as such, common numbering has been used where applicable. However, platform 200 includes a substrate head assembly 202 (which will be further discussed herein) positioned between each of the processing cell locations 102, 104 and processing cell locations 110, 112. The head assembly 202 is generally pivotally mounted at point 204 and has a substrate support assembly 206 extending therefrom. The support assembly 206 is caused to move between the adjacently positioned cell locations (cell locations 102, 104 or cell locations 110, 112) via pivotal movement of the head assembly 202 as indicated by arrow "A". Therefore, in this configuration, the mainframe robot 120 may be used to position a substrate on the head assembly 202, which may then be used to transfer the substrate between the activation cell locations 102, 112 and the electroless deposition cell locations 104, 110. This configuration provides for efficient transfer of the substrate from an activation cell (cell location 112 for example) to an electroless deposition cell (cell location 110 for example), minimal contamination of the activation layer during transfer, and allows for the mainframe robot 120 to remain clean of plating solution.

Figure 3:
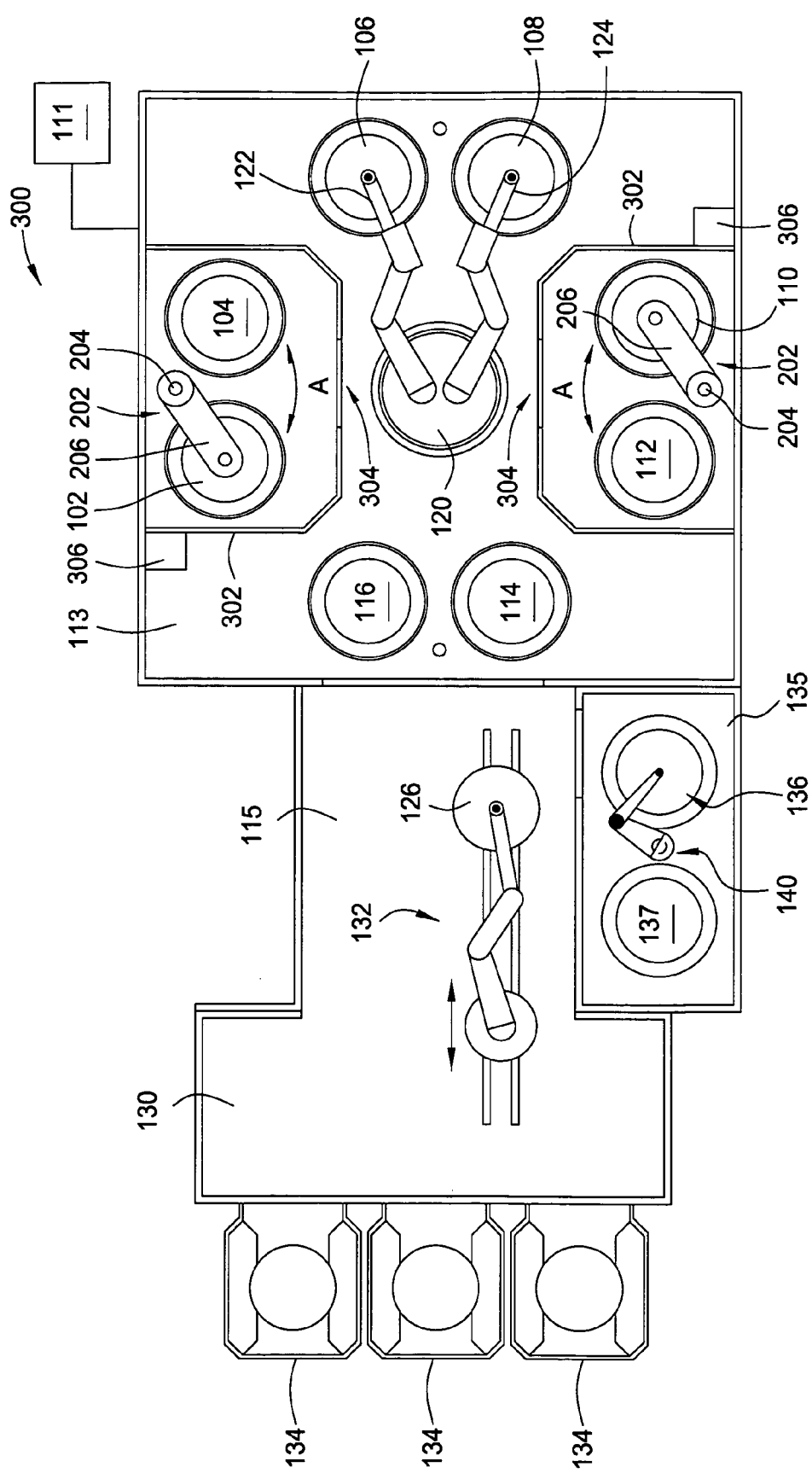
FIG. 3 illustrates a plan view of another embodiment of an electroless deposition platform of the invention.

FIG. 3 illustrates another embodiment of an electroless processing platform 300 of the invention. Platform 300 is similar to the platform illustrated in FIG. 2, and as such, numbering has been preserved where applicable. Platform 300 includes a fluid deposition processing enclosure 302 positioned to enclose the activation cell locations 102, 112, and the electroless deposition cell locations 104, 110. The processing enclosure 302 generally includes an environmentally controlled enclosure positioned on the processing mainframe 113 that has at least one access port 304, such as a slit valve, positioned such that mainframe robot 120 may selectively access the respective enclosures 302 to insert and remove substrates therefrom.

The processing enclosure 302 is connected to a processing gas source 306 positioned in fluid communication therewith. The processing gas source 306 is configured to provide a processing gas to the interior of processing enclosure 302. More particularly, the gas source 306 may be configured to provide an inert gas, such as nitrogen, helium, argon, hydrogen, mixtures thereof, or other gases commonly used in semiconductor processing, to the interior of processing enclosure 302 before, during, and after substrate processing steps. More particularly, prior to a substrate processing step, for example, the processing gas may be continually provided to the processing enclosure 302 and removed therefrom by an exhaust system or pump (not shown). When the access port 304 is opened to insert or remove a substrate from the processing enclosure 302, the flow of the processing gas to the processing enclosure 302 may be increased, such that a positive outward flow of the processing gas from the access port 304 is maintained. This positive outward flow of the processing gas minimizes the introduction of oxygen into the processing enclosure 302 during insertion and removal of substrates from the enclosure. Once the access port 304 is closed and a substrate is positioned in the processing enclosure 302 for processing, for example, the flow of the processing gas may be reduced and the interior of the processing enclosure may be purged. The purging process includes continually flowing processing gas into the processing enclosure 302 and removing the processing gas from the processing enclosure 302 by the exhaust or pump. This continual flow and removal of the processing gas operates to purge residual oxygen from the processing enclosure. In embodiments of the invention, the processing gas flow is generally introduced into an upper portion of the processing enclosure 302 above the processing locations. The processing gas flows downward toward the respective processing locations and is pumped or exhausted from the processing enclosure from locations in or below the respective processing locations.

A typical process for supplying the processing gas to the processing enclosure 302 may include supplying the inert gas at a flow rate of between about 10 slm to about 25 slm, or more particularly, between about 12 slm and about 20 slm. The flow rate of the inert gas may be reduced when the processing enclosure is closed, i.e., when the access port 304 is closed. The processing enclosure 302 may further include a vacuum pump (not shown) positioned in fluid communication with the interior volume of the processing enclosure 302. The vacuum pump may be used to further reduce the presence of unwanted gases in the processing volume via a purge pumping process. The interior of the processing enclosure 302 may also selectively be in fluid communication with a fabrication facility exhaust system. As such, the exhaust system may be used to evacuate or draw processing gases from the interior of the processing enclosure 302 to prevent pressurization of the enclosure as a result of the introduction of the processing gas into the sealed volume. The system controller 111 may be used to control the introduction and removal rates of the processing gas from the processing enclosure such that the environment within the processing enclosure 302 is controlled. Additionally, if particular processing techniques require further environmental control, the inventors contemplate that other control mechanisms, such as heaters, coolers, air filters or purification devices, humidifiers, etc. may be included inside or in connection with the processing enclosure 302 and controlled by controller 111.

With regard to the chemistry configuration of the platforms illustrated in FIGS. 1-3, platforms of this configuration will generally utilize single use chemistry cells, i.e., a dose of the process chemistry will be used for a single substrate and then discarded without being used to process additional substrates. For example, platforms 200 and 300 may utilize a common cell to activate, clean, and/or post process a substrate. Since each of these processes may utilize a different chemistry, the cell is generally configured to supply each of the required chemistries to the substrate when needed. However, the cells are generally not configured to recapture the chemistries, as substantial contamination issues are presented by recapturing different chemistries from a single cell.

For example, processing cell locations 102, 112 may be configured as activation and cleaning cells, while processing cell locations 104, 110 may be configured as electroless deposition cells. In this configuration, substrates will first be positioned in the activation/cleaning cell locations 102, 112, where the substrate may have a pre-activation cleaning solution, a rinsing solution, and/or an activation solution dispensed thereon. In embodiments where a pre-activation cleaning solution is used, the substrate will generally be rinsed after the cleaning solution is applied so that the substrate surface is free of the cleaning solution before the activation solution is applied. Once the activation solution is applied, the substrate is generally transferred from the activation/cleaning cell locations 102, 112 to the electroless deposition cell locations 104, 110. Cell locations 104, 110 are configured to dispense an electroless deposition solution onto the substrate to deposit the desired layer thereon. Once the electroless deposition process is complete, the substrate may be transferred back to the activation/cleaning cell, where the substrate may have a post deposition cleaning process conducted thereon. Once the post deposition cleaning process is completed, the substrate may be transported to one of the bevel clean cell locations 106, 108 or to one of the spin rinse dry cell locations 114, 116. Since the electroless deposition cell locations 104, 110 are not using differing chemistries in this embodiment, the electroless cells may be configured as multiple use chemistry cells, e.g., the chemistry for the cell may be recaptured and reused for multiple substrates until the chemical properties are no longer desirable for the process. However, if desired, the deposition cells may be used for an additional process, such as a post deposition cleaning process. In this configuration, the deposition cell will generally be setup as a single use-type chemistry cell, as the combination of the solutions being recaptured is generally not suitable for continued processing.

Figure 3A:
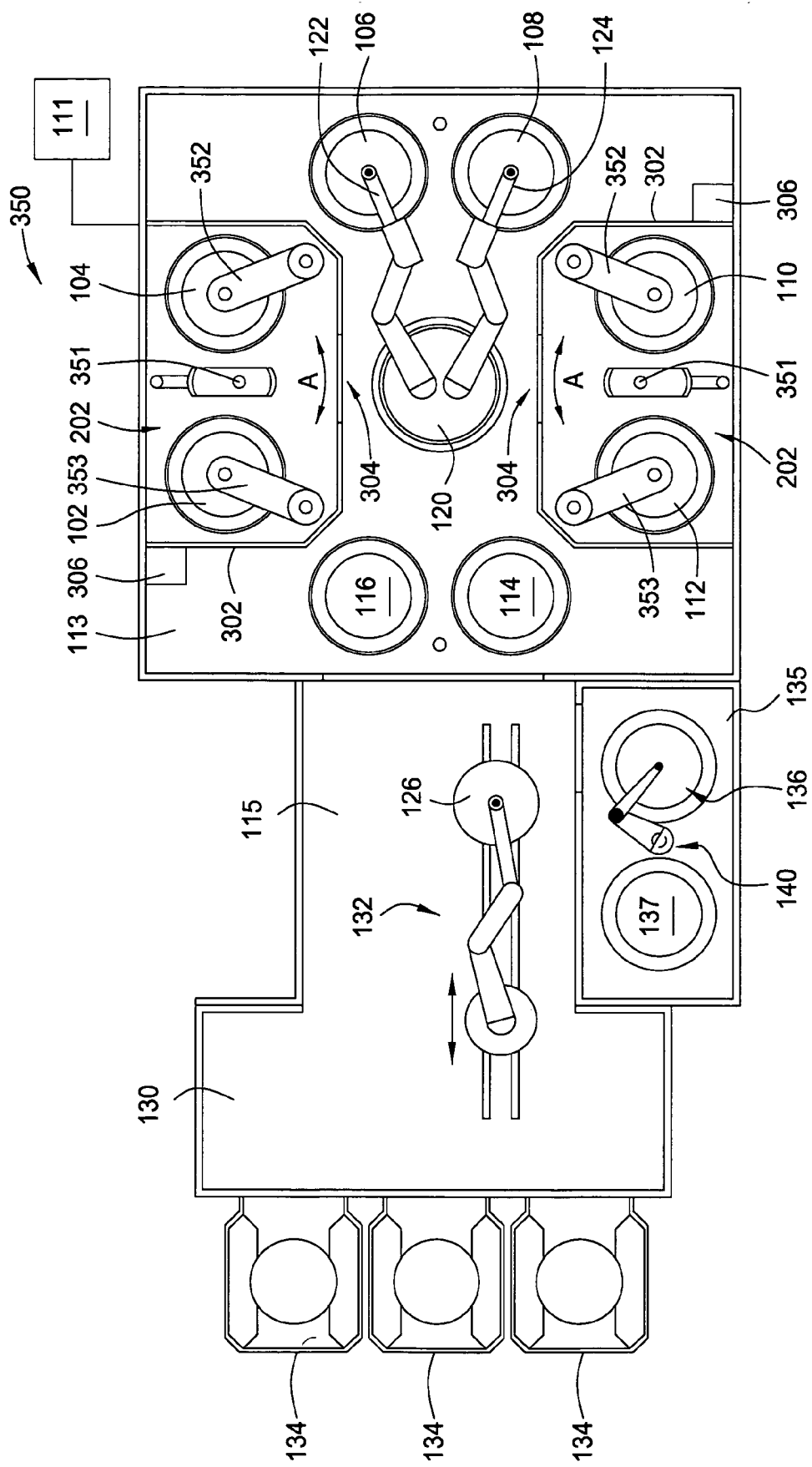
FIG. 3A illustrates a plan view of another embodiment of an electroless deposition platform of the invention.

FIG. 3A illustrates another embodiment of an electroless deposition platform 350 of the invention. FIG. 3A is similar to FIG. 3, and as such, numbering between the two figures has been preserved where applicable. Platform 350 includes the processing enclosure 302, as described in FIG. 3, however, the components within enclosure 302 are configured differently in this embodiment. For example, using the enclosure 302 on the lower portion of the drawing for discussion (the enclosure 302 on the opposing side of the platform 350 includes an identical, but mirrored configuration), processing cell location 112 includes a dedicated head assembly 353 that is configured to service processing cell location 112. Similarly, processing cell location 110 includes a dedicated head assembly 352 configured to service only processing cell location 110. As such, in this configuration, substrate shuttle 351 is positioned and configured to receive a substrate from the mainframe robot 120. The substrate is positioned on the shuttle 351, and shuttle 351 is pivoted to a position under one of the head assemblies 352, 353. The respective head assembly 352, 353 lowers to a position immediately above the substrate positioned on the shuttle 351, and the head assembly engages and secures the substrate thereto via a vacuum chucking, gravity, or other substrate securing process known in the semiconductor processing art. Once the substrate is secured to the head assembly 352, 353, the shuttle 351 is pivoted out from under the head assembly 352, 353.

The head assembly 352, 353 may then lower the substrate into the respective processing cell location 110, 112 for a fluid processing step. Once the fluid processing step is completed, the substrate may be removed from the fluid by the head assembly 352, 353 via raising of the substrate out of the fluid. Thereafter, shuttle 351 may be pivoted such that it is positioned under the substrate, and the head assembly 352, 353 may lower to position the substrate onto the shuttle 351 and disengage the vacuum chucking force to release the substrate such that it is supported by the shuttle 351. The head assembly 352, 353 may be raised and the shuttle 351 pivoted to an adjacent processing cell where another fluid processing step may be conducted, or alternatively, the shuttle 351 may be positioned such that the mainframe robot 120 may remove the substrate from the processing enclosure 302.

The hardware configuration illustrated in FIG. 3A may be implemented in an electroless deposition process. For example, processing cell locations 102 and 112 may be configured to conduct an electroless preclean process, an electroless activation process, and an electroless post activation cleaning process, while processing cell locations 104, 110 may be configured as electroless deposition cells and electroless post deposition cleaning cells. In this configuration, reclamation of the chemistries from the respective processes is possible. An advantage of the configuration illustrated in FIG. 3A is that the substrate may be transferred from an activation solution to an electroless deposition solution in an inert environment, as the processing space for the fluid processing cell locations 102, 104, 110, 112 is within the controlled environment processing enclosure 302, i.e., the access port 304 remains closed during the transfer step, and as such, the oxygen content in the processing enclosure may be controlled and maintained to a low level. Further, the processing enclosure 302 is flooded with an inert gas from gas supply 306, and as such, the interior of the processing enclosure 302 has a substantially reduced percentage of oxygen, for example, less than about 100 ppm of oxygen, or more particularly, less than about 50 ppm of oxygen, or further still, less than about 10 ppm of oxygen. Further, the configuration of the processing cell locations, shuttle 351, and head assemblies 352, 353 allows for transfer of the substrate from the activation cell to the electroless deposition cell in less than about 10 seconds. Both of these processes help to substantially prevent oxidation of the surface that is to be plated with the electroless process prior to the deposition process itself.

Generally, the embodiments of the invention illustrated in FIGS. 3 and 3A may be used with compatible or incompatible chemistries. For example, in a processing sequence that utilizes incompatible chemistries, e.g., acidic and basic solutions, the acidic solutions will generally be exclusively used in one cell, while the basic solutions are exclusively used in another cell. The cells may be adjacently positioned and substrates may be transferred between the respective cells by one of the shuttles. When compatible chemistries are used, a single fluid processing cell may be used to conduct each step of the process. For example, a single cell may be used to preclean the substrate, activate the substrate, clean the substrate post activation, conduct an electroless deposition process, and conduct a post deposition cleaning process. Further, when incompatible chemistries are used, the substrate may be processed in a first cell, then rinsed or cleaned in that cell or another adjacently positioned cleaning cell, before the substrate is transferred to another fluid process cell that uses a chemistry that is incompatible with the chemistry in the first cell. The rinsing step allows for incompatible chemistries to be removed from the surface of the substrate prior to the substrate being processed in subsequent cells where incompatible chemistries are used. Further, the inventors contemplate that the rinsing step preferably occurs insitu, i.e., in the same cell with the original chemistry application, as this configuration minimizes the likelihood of contaminating other elements in the processing system, e.g., the substrate shuttle 351, with chemical elements that may later react with other contaminants that make their way onto the shuttle 351.

Figure 4:
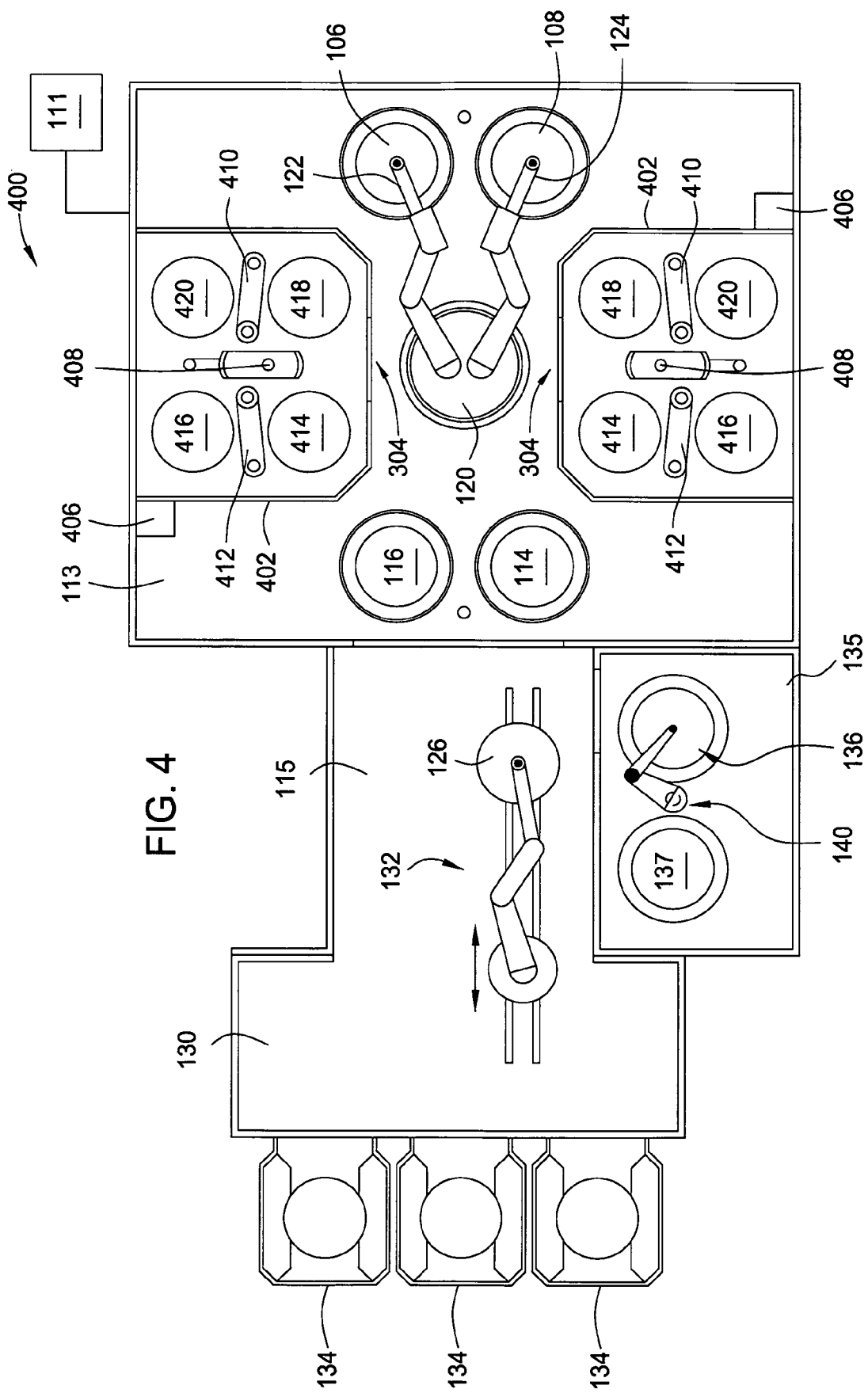
FIG. 4 illustrates a plan view of another embodiment of an electroless deposition platform of the invention.
Figure 5:
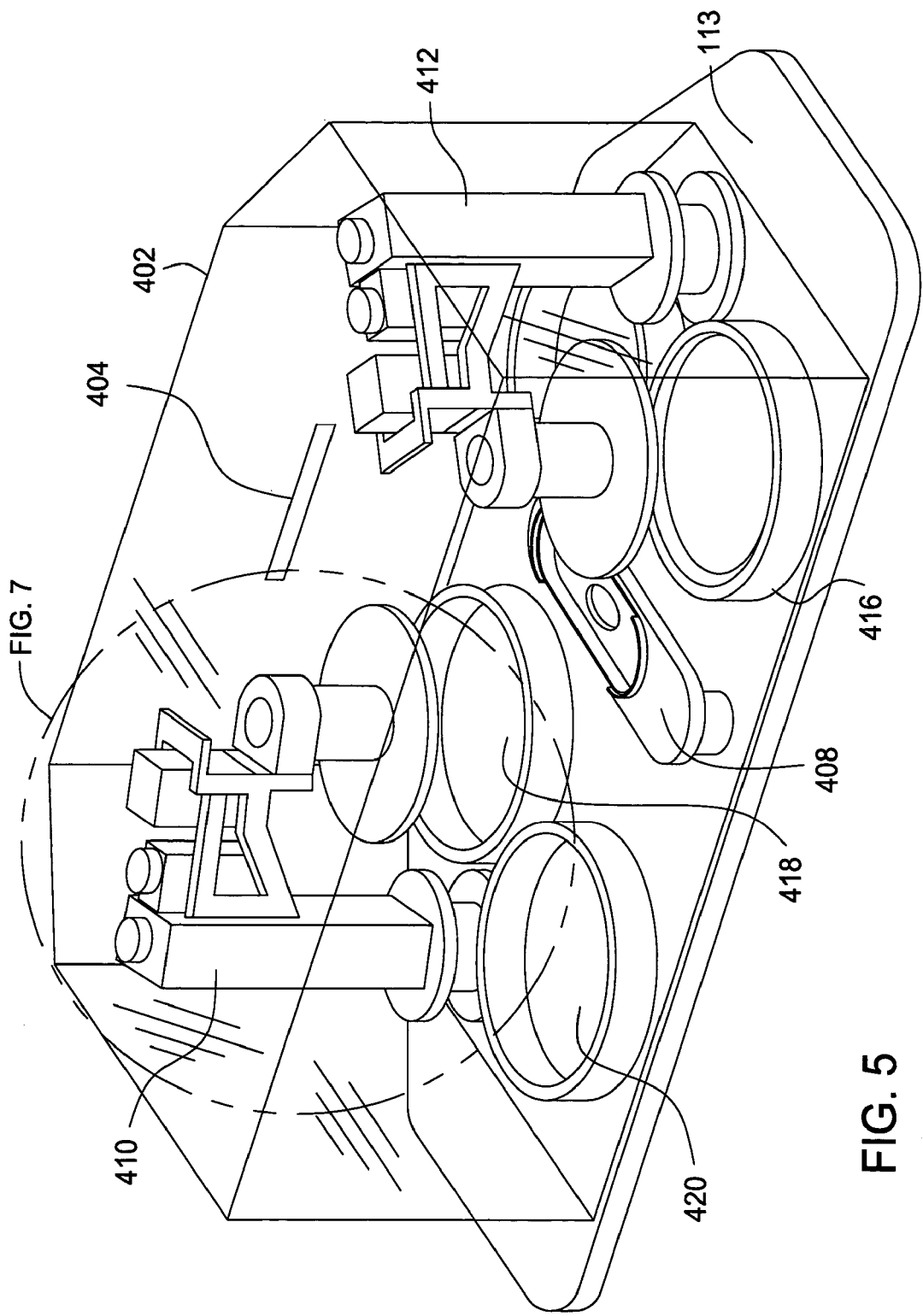
FIG. 5 illustrates a perspective view of the electroless deposition enclosure illustrated in FIG. 4.

FIGS. 4 and 5 illustrate another embodiment of an electroless deposition platform 400 of the invention. Deposition platform 400 generally includes similar platform features to the platform illustrated in FIGS. 1-3A, and as such, numbering has been preserved where applicable. However, the platforms are partially different at cell locations 102, 104, 110, 112 in platform 400. More particularly, platform 400 includes an enclosure 402 in communication with a gas supply source 406, and an access port 404 for inserting and removing substrates from the enclosure, in similar fashion to the previously illustrates platforms. However, platform 400 includes four processing locations within each enclosure 402, as opposed to the two processing locations illustrated in the enclosure 302 in platform 300, for example. The four processing locations within the enclosure 402 include cell locations 414, 416, 418, 420. These processing locations may be configured as a combination of activation cells, cleaning cells, rinsing cells, and electroless deposition cells. For example, cell locations 414 and 418 may be configured as activation cells, and cell locations 416 and 420 may be configured as electroless deposition cells (the structure and configuration of these cells will be further discussed herein). In this configuration, platform 400 also includes a first substrate transfer shuttle 408 (also illustrated in FIG. 8) positioned to transport substrates between the outer processing cell locations 414, 418, i.e., cells positioned closest to the mainframe robot 120. In this configuration, shuttle 408 may be used to receive a substrate from the mainframe robot 120 and transfer the substrate to one of cell locations 414, 418 for processing. Similarly, the shuttle may be used to remove substrates from cell locations 414, 418 so that mainframe robot 120 may remove the substrate from the enclosure 402.

Figure 8:
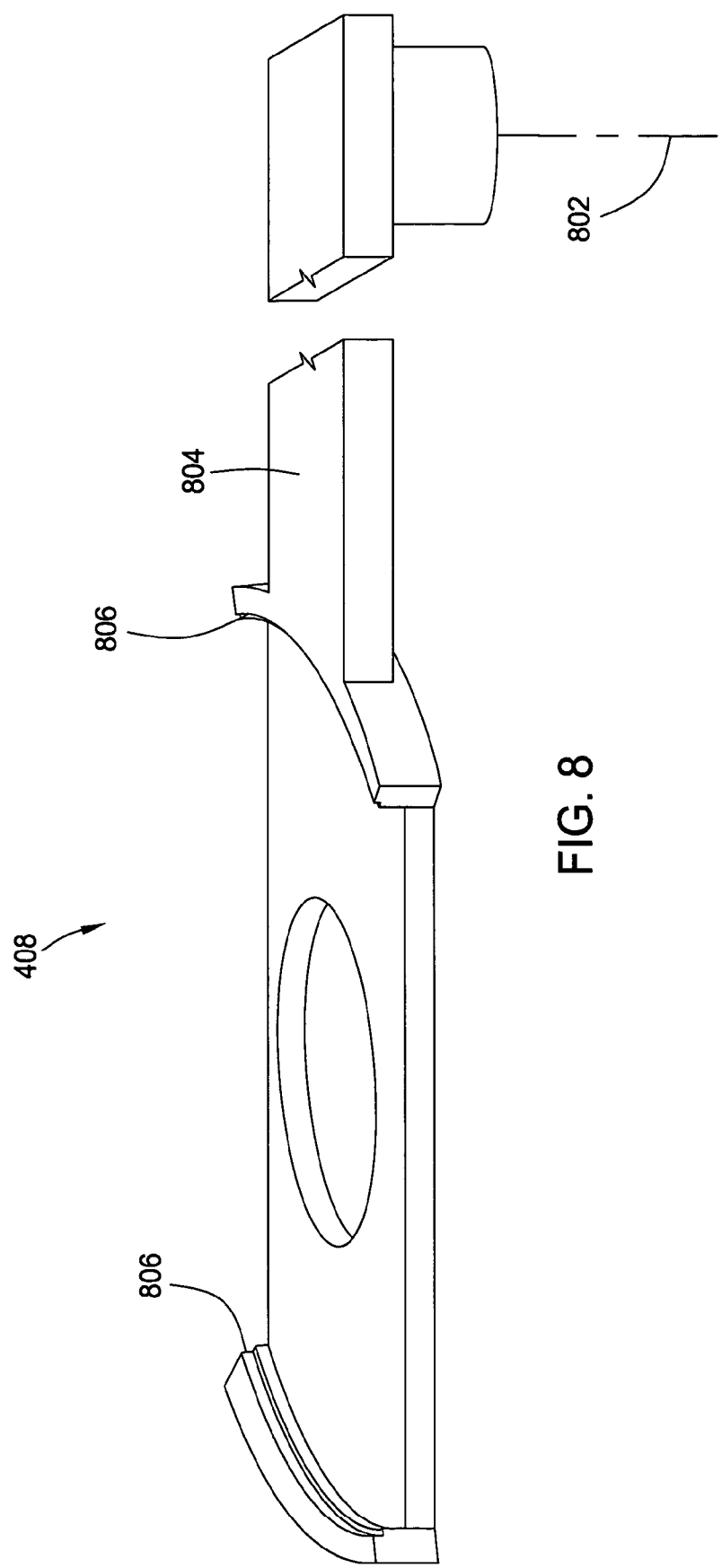
FIG. 8 illustrates a perspective view of a substrate shuttle of the invention.

The substrate shuttle 408, which is illustrated in more detail in FIG. 8, generally includes a pivotally mounted arm member 804 (mounted at a pivot point 802) that includes a distal substrate supporting surface 806. The substrate support surface 806 is configured to support a substrate in a face down manner via contact with the outer perimeter of the substrate, so as to not damage the production surface of the substrate. Once the substrate is positioned on the substrate support surfaces 806, the arm may be pivoted to a position above one of the processing cell locations 414, 418, where a head assembly may pick the substrate off the support surfaces 806 for processing.

Substrate support head assemblies 410, 412 are generally positioned between the respective processing cell locations 418, 420 and 414, 416. These head assemblies 410, 412 are generally configured to transfer substrates between the processing cells positioned on each side of the head assembly 410, 412 and to support the substrates during processing in the respective cells. For example, head assembly 420 is configured to transfer substrates between processing cell 418 and processing cell 420, and similarly, head assembly 412 is configured to transfer substrates between processing cell 414 and processing cell 416.

Although the head assemblies illustrated herein are generally illustrated as face down-type head assemblies, embodiments of the invention are not intended to be limited to this configuration. For example, the head assemblies of the invention may be configured to support substrates in a face up configuration, as is generally known in the art. Similarly, although the processing cells illustrated herein are generally illustrated as receiving and processing substrates in a face down configuration, embodiments of the invention are not intended to be limited to this configuration, as the processing cells may be configured as either face up or face down-type processing cells.

In the platform configuration illustrated in FIGS. 4 and 5, the head assemblies 410, 412 may be used to support a single chemistry electroless deposition configuration as follows. For example, processing cell locations 414, 418 may be configured as activation/rinse cells, and processing cell locations 416, 420 may be configured as electroless deposition cells. In this configuration, substrates may be delivered to the processing enclosure 402 by mainframe robot 120. Thereafter, the substrate may be transported to one of the activation and rinse cell locations 414, 418 by shuttle 408, where one of the head assemblies 410, 412 then supports the substrate for processing. In the activation rinse cell locations 414, 418, the substrate may be cleaned and/or rinsed prior to being activated. Thereafter, an electroless activation solution may be dispensed onto the substrate surface. Once the substrate surface is activated, it may be rinsed and/or cleaned and transferred to the electroless deposition cell 416, 420 by a respective head assembly 410, 412, where the substrate surface may be exposed to an electroless deposition solution for deposition. Once the deposition process is complete, the substrate may be transferred back to the activation/rinse, cell locations 414, 418 by the head assembly 410, 412 for another activation layer, if desired, or for a rinsing process. If additional deposition is desired, the activated substrate may be transported to another deposition cell for further processing. If the desired deposition process is complete at this point, the substrate may be removed from the activation cell locations 414, 418 by shuttle 408, and then subsequently removed from the enclosure 402 by the mainframe processing robot 120. In this configuration two substrates may be processed through enclosure 402 at a time, i.e., one substrate utilizes cell locations 414, 416, while the second substrate utilizes cell locations 418, 420.

However, in another embodiment of the invention, the platform illustrated in FIGS. 4 and 5 may be configured as a single substrate multi-chemistry processing enclosure. More particularly, enclosure 402 may be configured to process a single substrate using each of the cell locations 414, 416, 418, 420. Each of the cells may include different chemistries, e.g., an acidic electroless deposition and/or activation chemistry and a basic electroless and/or activation chemistry. In this embodiment, a substrate may first be positioned in an activation cell positioned at cell location 418, where a reduced or increased temperature head assembly may be used to support the substrate while an acidic reactive preclean chemistry is dispensed onto the substrate. The reduced temperature head assembly may include a substrate support surface that is configured as a heat absorbing member, e.g., flowing a cooling fluid through an interior portion of the head assembly to reduce the temperature of the substrate support surface. The increased temperature head assembly may include a substrate support surface that has fluid or resistive heaters positioned therein that are configured to control the temperature of the substrate support surface. The substrate may then be transferred to an electroless activation cell positioned at cell location 420, where an acidic activation solution is dispensed onto the substrate. Thereafter, the substrate may be returned to cell location 418 for a post activation clean process, and then the substrate may be transferred to an alkaline or basic preclean cell at cell location 414 (via shuttle 408 and head assembly 412), where an alkaline or basic cleaning solution is dispensed onto the substrate surface.

The head assembly 412 used to support the substrate for the acidic activation, cleaning, or deposition processes may include a heater positioned therein that is configured to heat the substrate support surface of the head assembly, and as a result thereof, heat the substrate during the activation, cleaning, or deposition processes. The heated cleaning process may also include heating the cleaning fluid to a temperature of between about 80° C. and about 90° C., for example, and/or heating the support member that is in contact with the substrate to the heated temperature. The substrate may then be transferred to an electroless deposition cell at cell location 402, which may also include a basic or alkaline electroless deposition solution, before the substrate is returned to cell location 414 for post processing, i.e., post deposition rinsing and/or cleaning. In this embodiment, each individual cell may contain a particular chemistry, e.g., an activation chemistry, an electroless chemistry, a preclean chemistry, etc., which allows for the chemistries in the cells to be used for more than one substrate, as issues related to cross chemistry contamination within a single cell are eliminated.

Figure 6:
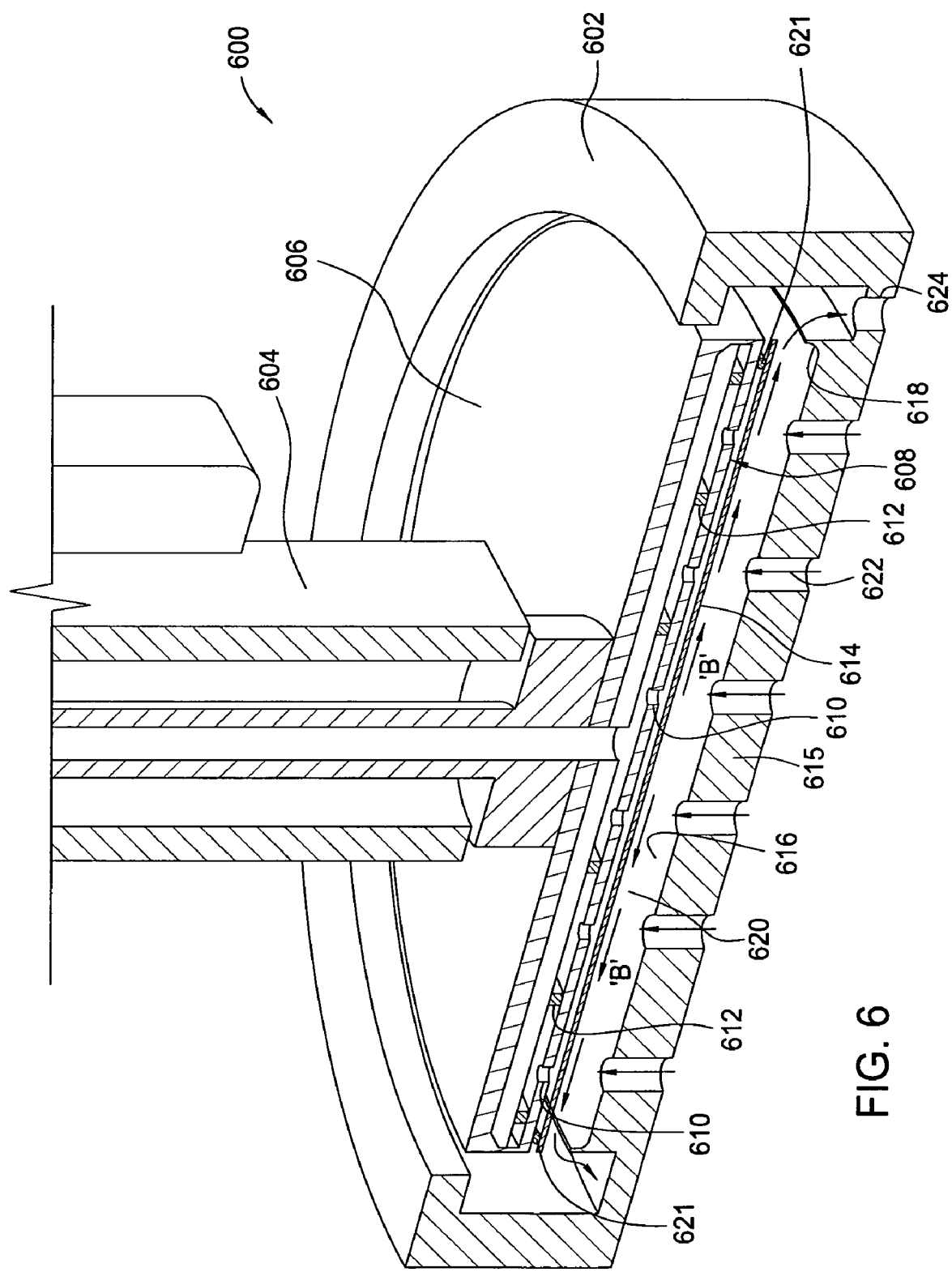
FIG. 6 illustrates a perspective and partial sectional view of a fluid processing cell of the invention.
Figure 7:
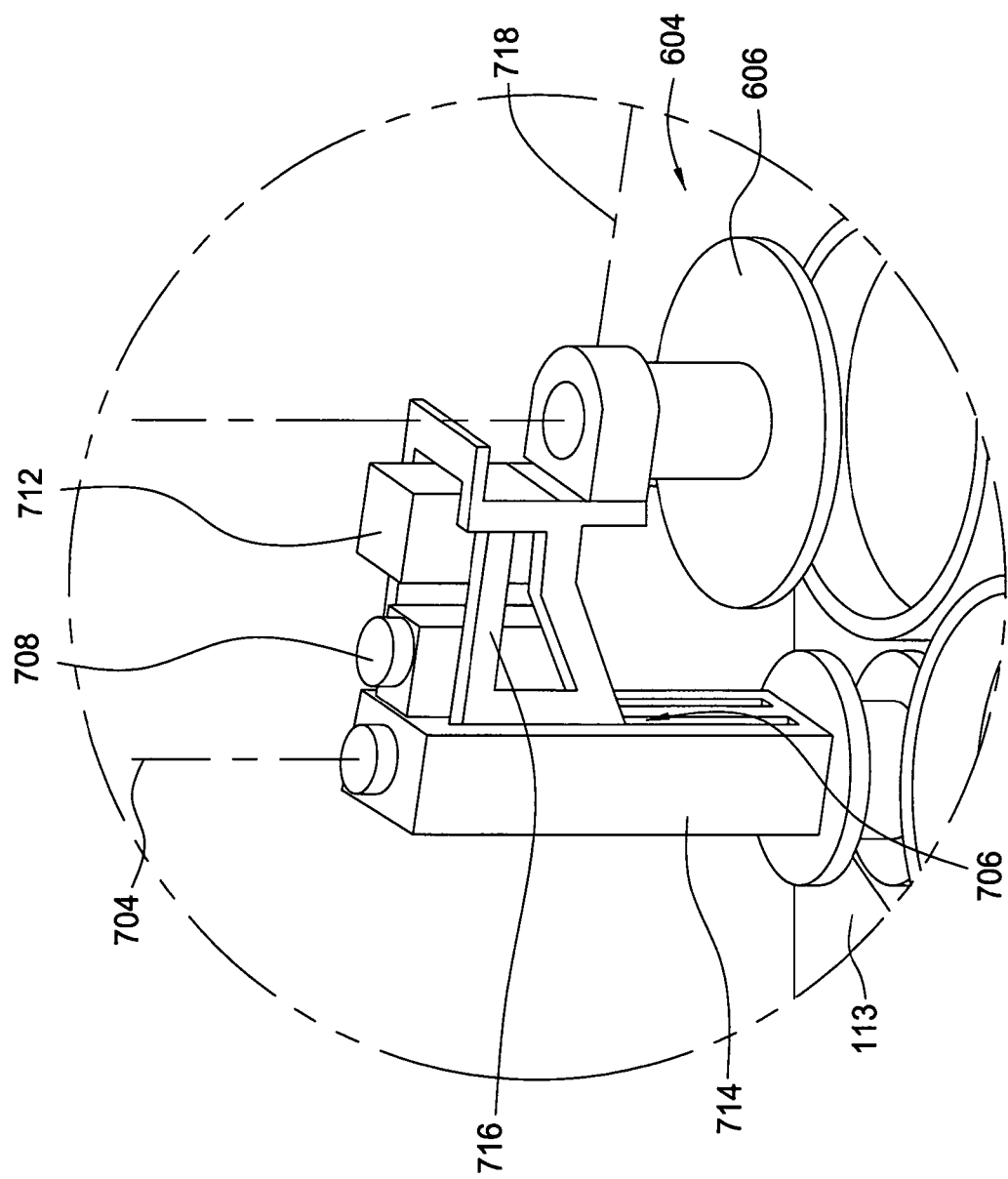
FIG. 7 illustrates a perspective view of a head assembly of the invention.

FIG. 6 illustrates a perspective and partial sectional view of an exemplary fluid processing cell 600 and a lower portion of head assembly 604 of the invention. The fluid processing cell 600 may be used as an electroless deposition cell, an activation cell, and/or a cleaning/rinsing cell in any of the embodiments described herein. The fluid processing cell 600 generally includes a cell body 602 having a head assembly 604 that is movably positioned above the cell body 602. The cell body may be manufactured from various substances known to be nonreactive with fluid processing (electroless or ECP) solutions, such as plastics, polymers, and ceramics, for example. The head assembly 604, which is also illustrated in FIG. 7, generally includes a substrate support member 606 that is configured to rotate, horizontally or pivotally actuate, and vertically actuate as well as being sized to be received within the opening of cell body 602. The substrate support member 606 includes a substantially planar support surface 608, also generally termed a platen, that has a plurality of vacuum apertures 610 formed therein. The support surface 608 may be coated or manufactured from a material that is nonreactive with fluid processing solutions, such as ceramics or plastics. The vacuum apertures 610 are selectively in fluid communication with a vacuum source (not shown), and as such, the vacuum apertures 610 may be used to vacuum chuck a substrate 614 to the support surface 608. An annular seal 621, such as an o-ring type seal, for example, is positioned near the perimeter of the substrate support surface 608. The seal 621 is generally configured to engage the backside of the substrate 614 being vacuum chucked to the substrate support surface 608 to create a vacuum tight seal between the substrate support surface 608 and the substrate 614 to facilitate the vacuum chucking process, while also preventing fluids from contacting the backside of the substrate.

The interior of the substrate support member 606 may include a heater assembly, which may comprise a plurality of concentrically positioned heating bands 612. The heating bands 612 may include resistive heaters, fluid passages configured to have a heated fluid flowed therethrough, or another method of heating a substrate support member for a semiconductor processing method. The plurality of heating bands 612 may be individually controlled, if desired, to more accurately control the substrate temperature during processing. More particularly, individual control over the heating bands 612 allows for precise control over the deposition temperature, which is critical to electroless deposition processes. The substrate support member 606 may further include an actuator or vibration device (not shown) configured to impart megasonic or other vibrational energy to substrate 614 during processing.

A bottom central portion of the cell body 602 includes a fluid processing basin 615. The basin 615 generally includes a substantially planar basin surface 616 having an annular fluid weir 618 circumscribing the basin surface 616. The fluid weir 618 generally has a height of between about 2 mm and about 20 mm, and is generally configured to maintain a processing fluid in a puddle-type configuration on the basin surface 616 in a processing region 620. The basin surface 616 also includes a plurality of fluid apertures 622 formed therein. The fluid apertures 622 are generally in fluid communication with a plurality of processing fluid sources, such as rinsing solution sources, activation solution sources, cleaning solution sources, electroless deposition solution sources, and other fluid sources that may be used in an electroless deposition process. As such, apertures 622 may be used to supply processing fluids to the processing region 620. The processing fluid will generally flow upward through the apertures 622, and then outward through the processing region 620 toward weir 618, as indicated by arrows "B". A fluid drain 624 is generally positioned in an outer lower portion of the cell body 602, generally outward of the fluid weir 618. As such, the fluid drain 624 is configured to collect fluid that overflows weir 618.

The head assembly 604, which is also illustrated in FIG. 7, generally includes a vertical mounting post 714 that is pivotally attached to processing mainframe 113, generally at a position between two processing cells, i.e., head assembly 604 is positioned such that the post member 714 may be rotated about axis 704 to selectively position the substrate support member 606 over each of the adjacently positioned processing cells. Head assembly 604 further includes a structural arm member 716 attached to post member 714 and extending therefrom. The structural arm member 716 is movably positioned to the post member 714, i.e., the vertical position of arm member 716 may be adjusted relative to the post member 714, through, for example, a gear arrangement where first geared motor 708 engages a vertical track 706 on the side of post 714 to selectively move the arm member 716 vertically along the track 706. A second motor 712 is positioned on arm member 716 and is in communication with the substrate support member 606. The second motor is configured to impart rotational movement to the substrate support member 606.

In another embodiment of the invention, the head assembly 604 may additionally be configured to tilt the substrate support member 606, i.e., in addition to vertically, pivotally (horizontally), and rotationally moving the substrate. In this embodiment, the rotor axis of the second motor 712 may be positioned on the axis of rotation of the substrate support member 606, and the combination of the motor 712 and the substrate support member 606 may be pivotally mounted to the arm member 716 about an axis 718. This configuration allows for the plane of the substrate to be tilted from horizontal before, during, or after a processing step to facilitate, for example, a tilted immersion process, if desired.

In another embodiment of the invention, the head assembly 604 may include a multi-zone vacuum chuck-type substrate support surface configured to control the chucking force across a plurality of zones on the backside of the substrate. Generally, this type of head assembly utilizes a membrane positioned over a substrate support surface, and the membrane is positioned against the backside of the substrate and sealed at the perimeter. A vacuum is then applied between the substrate support surface and the membrane, thus causing the membrane to pull toward the substrate support surface and into one or more recesses formed therein. This generates a vacuum between the membrane and the substrate, which operates to chuck the substrate to the membrane and the substrate support surface. A detailed description of a head assembly that utilizes a membrane to chuck a substrate may be found in commonly assigned U.S. Pat. No. 6,183,354, entitled "Carrier Head with Flexible Membrane for a Chemical Mechanical Polishing System", filed on May 21, 1997, issued on Feb. 6, 2001, which is hereby incorporated by reference in its entirety.

In operation, embodiments of the invention, and in particular, platform 400, may be used to deposit a capping layer onto a substrate via an electroless deposition process. This process begins with platform 400 receiving a substrate that has a dielectric layer with features formed into the dielectric layer, and a conductive material (generally copper) filling the features thereon. Further, the substrate generally has a substantially planar production surface that exposes the dielectric layer in the field regions and the upper surfaces of the copper filled features. The substantially planar upper surface of the dielectric layer and the features generally results from the completion of a chemical mechanical polishing process or other post feature fill planarization process that is generally conducted on another processing platform.

The substrate 126 is received into platform 400 via one of loading stations 134 and is transported to one of processing cell locations 114, 116 by robot 132. At processing cell locations 114, 116, which is generally configured as a substrate spin rinse dry cell, the substrate 126 may be initially rinsed and/or cleaned with a cleaning solution. Alternatively, the substrate 126 may simply be passed through cell locations 114, 116 and picked up by mainframe robot 120. Mainframe robot engages the substrate 126 and transfers the substrate to the processing enclosure 402 via access valve 404, for example. During the transfer process, processing gas source 406 is flowing an inert gas, generally nitrogen or a mixture of nitrogen and another gas such as hydrogen, into the interior of the processing enclosure 402. This gas flow generally operates to flood the interior of processing enclosure 402 with the inert gas and minimizes unwanted oxygen containing ambient air from entering into the processing enclosure via the open access valve 404 while a substrate is being received.

Once the substrate 126 is inserted into the processing enclosure 402, the substrate 126 is positioned in a face down orientation on substrate shuttle 408. The mainframe robot blade 120 retracts from the processing enclosure 402 and the access valve 404 closes. The process gas source may continue to flood the interior volume of the processing enclosure 402 with nitrogen for a period of time, if desired, in order to further minimize oxygen content in the processing enclosure 402. This may be accomplished by opening one or more vents or exhaust passages that communicate the interior of the processing enclosure 402 to the ambient.

With the substrate 126 positioned on the shuttle 408 and the processing enclosure flooded with nitrogen, the process continues with the shuttle 408 transporting the substrate 126 to head assembly 412. More particularly, shuttle 408 pivots so that the substrate 126 is positioned below the head assembly 412, and the head assembly 412 lowers the substrate support surface 608 to a position immediate the backside of the substrate 126 as it sits on the substrate shuttle 408. The substrate support surface 608 may be brought into contact with the backside of the substrate 126. Once surface 608 is positioned immediate the backside of the substrate 126, vacuum apertures 610 are activated and the substrate 126 is vacuum chucked and sealed to the support surface 608. The head assembly 412 then raises substrate 126 vertically off of shuttle 408 and shuttle 408 is pivoted away from substrate 126.

The substrate 126 may then be lowered into the fluid basin 620 of processing cell location 414, where the substrate 126 may be cleaned by applying a dielectric clean solution to the substrate 126. The dielectric clean solution may include one or more acids (such as citric acid, HF, and/or HCl) and may include one or more corrosion inhibitors. The corrosion inhibitors may include any of various chemical compounds, for example organic compounds containing an azole group, such as benzotriazole, mercapto-benzotriazole, or 5-methyl-1-benzotriazole. The dielectric cleaning step may be conducted with the heater 612 activated such that the substrate temperature is between about 20° C. and about 60° C.

Generally, the dielectric clean solution is configured to remove metallic residues from the exposed portion of the dielectric layer. It is also believed that the corrosion inhibitor protects the exposed portion of the copper layer during the dielectric clean process. If the metallic residues are not removed, unwanted electroless deposition will generally occur over these metallic residues on the dielectric.

In another embodiment of the invention, the substrate is delivered to processing platform 400 with the dielectric clean step already conducted. In this embodiment, the process sequence of the invention would simply skip the dielectric clean step and proceed to the copper clean step, which is described below.

Once the dielectric clean process is completed, the process continues to a copper cleaning process. This portion of the process is generally also conducted in processing cell 414. More particularly, the head assembly 412 may be raised to remove the substrate 126 from the processing fluid, and then the processing fluid may be switched from the dielectric cleaning solution to a copper cleaning solution. Once the copper cleaning solution is positioned in the processing volume 620, the substrate 126 may be lowered in to the solution. One example of a suitable copper clean solution is the Electra Clean™ solution commercially available from Applied Materials, Inc., of Santa Clara, Calif. Another example of a suitable copper clean solution includes sulfuric acid and HCl. Still another example of a suitable copper clean solution includes a mixture of citric acid and peroxide.

The copper clean solution is generally configured to remove copper oxides and any residual dielectric clean solution. For example, the copper clean solution may remove the corrosion inhibitor of the dielectric clean solution remaining on the exposed portion of the copper layer. Corrosion inhibitor remaining on the exposed portion of the copper layer may inhibit formation and/or adhesion of the capping material thereover in subsequent processing steps. In one embodiment, a thickness of less than about 50 Å, preferably less than about 30 Å, of the copper layer and a thickness of less about 50 Å, preferably less than about 30 Å, of the dielectric layer is etched by the copper clean solution.

After the copper clean step, the substrate is transferred to processing cell 416 by head assembly 412, where an activation solution may be applied to the substrate structure. Processing cell 416 is structurally similar to the processing cell 414 (as illustrated in FIG. 6), and as such, the details of the head assembly 412 immersing the substrate 126 into the processing volume 420 will be skipped. One example of an activation solution that may be used in activation cell location 416 includes palladium salts. Examples of palladium salts include chlorides, bromides, fluorides, fluoborates, iodides, nitrates, sulfates, carbonyls, salts of metal acids, and combinations thereof. Preferably, the palladium salts are chlorides, such as palladium chloride ($PdCl_2$), chloroplatinic acid ($H_2PtCl_6$), and combinations thereof. The queue time between the end when the copper clean solution is applied in cell location 414 and start time of when the activation solution is applied in cell location 416 is generally less than about 15 seconds, and preferably less than about 5 seconds. As such, the head assembly 412 moves directly from the copper clean solution in cell location 414 to the activation solution in cell location 416 with no delay.

The activation solution generally operates to deposit an activated metal seed layer on to the exposed copper of the features. As a consequence, oxidation of the exposed portion of the copper layer after cleaning thereof may be detrimental to deposition of the metal seed layer over the exposed portion of the copper layer, as copper oxides are known to have a higher electrical resistivity than copper. The short queue time between copper clean and activation minimizes oxidation, while the inert gas environment also helps to prevent oxidation of the exposed portion of the copper layer.

Once the activation process is complete, the substrate 126 may be moved back to cell location 414 or to cell location 418, where a post-activation clean may be performed by applying a post-activation clean solution to the substrate 126. The post-activation clean solution may include one or more acids (such as citric acid, HF, and/or HCl). The queue time between the end when the activation solution is applied and start of when the post-activation clean solution is applied may be less than about 15 seconds, and preferably less than about 5 seconds.

The post-activation clean solution generally operates to remove any of the activation metal seed layer from the exposed portion of the dielectric layer so that the activation metal seed layer remains only on the exposed portion of the copper layer. Remaining activation metal seed layer on the exposed portion of the dielectric layer may cause undesirable electroless deposition of the capping material thereover.

Once the activated layer is cleaned, the substrate is transferred to cell location 420, where a capping layer may be deposited by selective electroless deposition over the activated portion of the exposed copper layer by application of an electroless deposition solution to the substrate structure. The capping layer may include CoP, CoWP, CoB, CoWB, CoWPB, NiB, or NiWB, and preferably includes CoWP or CoWPB. The electroless deposition solution may include one or more metal salts and one or more reducing agents, depending of the capping layer material to be deposited. The electroless deposition solution may also include pH adjusters, such as acids or bases, as is generally known in the art.

When the selected capping layer contains cobalt, the electroless deposition solution generally includes a cobalt salt. Examples of cobalt salts include chlorides, bromides, fluorides, fluoborates, iodides, nitrates, sulfates, carbonyls, salts of metal acids, and combinations thereof. Preferably, the cobalt salt includes cobalt sulfate, cobalt chloride or combinations thereof. If a tungsten-containing capping material is to be deposited, the electroless deposition solution includes a tungsten salt. Examples of tungsten salts include chlorides, bromides, fluorides, fluoborates, iodides, nitrates, sulfates, carbonyls, salts of metal acids, and combinations thereof. Preferably, the tungsten salt includes a salt of tungsten acid, such as ammonium tungstate or tetramethyl ammonium tungstate. Preferably, the tungsten salt includes ammonium tungstate. If a nickel-containing capping material is to be deposited, the electroless solution generally includes a nickels salt. Examples of nickel salts include chlorides, bromides, fluorides, fluoborates, iodides, nitrates, sulfates, carbonyls, salts of metal acids, and combinations thereof.

When the selected capping material includes phosphorus, such as CoP, CoWP, or CoWPB, the reducing agent preferably includes a phosphorus compound, such as sodium hypophosphite. If the capping material includes boron, such as CoB, CoWB, CoWPB, the reducing agent generally includes a boron compound, such as sodium borohydride, dimethylamine-borane (DMAH), or combinations thereof. Other reducing agents may also be used in addition to or alternatively with the reducing agents above, such as hydrazine.

The electroless deposition solution and/or the substrate may be heated to a temperature of between about 40° C. and about 85° C. In one aspect, heating the electroless deposition solution and/or the substrate structure increases the electroless deposition rate. In one embodiment, the deposition rate of the capping material is about 100 Å/min or more, preferably about 200 Å/min or more. In one embodiment, the capping material is deposited to a thickness between about 100 Å and 200 Å, preferably about 150 Å. However, it is important to maintain the temperature across the substrate at a uniform temperature, as the deposition rate of an electroless process is known to be highly dependent upon temperature. As such, the annular bands of heaters 612 illustrated in FIG. 6 and/or a temperature controlled process fluid supply source may be used.

Once the desired thickness of the capping layer has been formed by the electroless deposition process, a post deposition clean step may be performed by applying a post-deposition clean to the substrate structure. The post deposition is generally conducted in cell 418, and as such, the substrate may be transferred thereto by the head assembly 410. In one embodiment, the post-deposition clean may include one or more acids (such as citric acid, HF, and/or HCl). The post-deposition clean is generally configured to remove capping material that may be present on the exposed portion of the dielectric layer.

Once the post deposition clean step is completed, the substrate 126 may be removed from the processing enclosure 402. This generally involves the head assembly 410 transferring the substrate 126 to the substrate shuttle 408, and the mainframe robot 120 entering into the enclosure 402 and removing the substrate 126 from the shuttle 408.

Thereafter, the mainframe robot may transfer the substrate to one of processing cell locations 106, 108 for a bevel cleaning process, where the bevel edge of the substrate 126 may be cleaned to remove any accumulated material therefrom (often called the edge bead) by providing an etchant solution to the bevel edge. One example of an etchant solution includes a solution of sulfuric acid, hydrogen peroxide, and deionized water. Another example of an etchant solution includes nitric acid solutions. In one embodiment of the invention, processing cell locations 106, 108 do not include bevel cleaning stations, rather, another processing enclosure as described herein that may be used for activation and deposition may be positioned in locations 106, 108.

Once the bevel cleaning process in completed, the substrate 126 is generally transferred by mainframe robot 120 to one of processing cells 114, 116, where a substrate rinse and dry process is conducted. In one embodiment, the substrate structure may be dried in a spin-rinse-dry cell, and in another embodiment, the substrate structure is dried by vapor dry cell. Vapor drying includes introducing a surface tension-reducing volatile compound, such as a volatile organic compound (VOC), to the substrate structure. For example, a VOC may be introduced with a carrier gas (such as nitrogen gas) in the vicinity of the liquid adhering to a substrate structure. The introduction of the VOC results in surface tension gradients which cause the liquid to flow off of the substrate, leaving it dry. In one embodiment, the VOC is isopropyl alcohol (IPA). In one aspect, drying the substrate structure by vapor drying reduces the formation of water marks left on the substrate by other drying methods.

Once the substrate 126 is rinsed and dried, robot 132 is used to transfer the substrate 126 to the annealing station 135. The substrate 126 is then annealed to help outgas any water or moisture absorbed into the pores of the dielectric or metal layers. The substrate structure may be heated by a resistive heater or by heat lamps to a temperature of between about 200° C. and about 350° C.

While the foregoing is directed to embodiments of the present invention, other and further embodiments of the invention may be devised without departing from the basic scope thereof, and the scope thereof is determined by the claims that follow.

What is claimed is:

1. A fluid deposition system for semiconductor processing, comprising:
    a mainframe having a substrate transfer robot positioned thereon;
    at least two substrate processing enclosures positioned on the mainframe, wherein each of the at least two substrate processing enclosures is environmentally controlled from the mainframe and is accessible to the substrate transfer robot via an access port formed through a wall of the substrate processing enclosure, each of the substrate processing enclosures has at least two substrate fluid processing cells positioned therein; and
    a processing gas source and a processing gas exhaust system in fluid communication with each of the at least two substrate processing enclosures, wherein the at least two substrate fluid processing cells comprise an electroless fluid activation cell and an electroless fluid deposition cell positioned adjacent each other in the substrate processing enclosure.

2. The fluid deposition system of claim 1, further comprising a substrate transfer shuttle positioned between the electroless fluid activation cell and the electroless fluid deposition cell, the substrate transfer shuffle being configured to transfer substrates between the electroless fluid activation cell and the electroless fluid deposition cell.

3. The fluid deposition system of claim 1, wherein the electroless fluid activation cell and the electroless fluid deposition cell each comprise a substrate support member configured to support a substrate during fluid processing in the respective cells, the substrate support member having a temperature control assembly therein.

4. The fluid deposition system of claim 3, wherein the temperature control assembly comprises a plurality of individually controlled heating elements positioned in the substrate support member.

5. The fluid deposition system of claim 3, wherein the temperature control assembly further comprises a plurality of fluid conduits formed into the substrate support member, the plurality of fluid conduits being in fluid communication with a cooled fluid source.

6. The fluid deposition system of claim 4, wherein the electroless fluid activation cell and an electroless fluid deposition cell each comprise:
    a processing fluid basin having a fluid retention weir surrounding the processing fluid basin; and
    at least one processing fluid supply aperture positioned on the processing fluid basin, the processing fluid supply aperture being in fluid communication with a processing fluid source.

7. The fluid deposition system of claim 6, wherein the substrate support member further comprises a substrate support surface positioned facing the fluid basin such that a substrate supported thereon is processed in a face-down configuration.

8. An electroless fluid processing assembly, comprising
    a processing enclosure positioned on a substrate processing system, the substrate processing enclosure having an access port configured to allow access to an interior portion of the processing enclosure by an external robot;
    an electroless activation cell positioned in the interior portion of the processing enclosure;
    an electroless deposition cell positioned in the interior portion of the processing enclosure;
    a processing gas supply in selective fluid communication with the interior portion of the processing enclosure;

a processing gas exhaust system in selective fluid communication with the interior portion of the processing enclosure;

a substrate transfer shuffle positioned in the interior portion of the processing enclosure between the electroless activation cell and the electroless deposition cell; and at least one of an annealing station and a cleaning cell disposed in an exterior portion of the processing enclosure in the substrate processing system.

9. The electroless fluid processing assembly of claim 8, further comprising:

a controller in electrical communication with the processing gas supply and the processing gas exhaust system.

10. The electroless fluid processing assembly of claim 9, wherein the controller is configured to cooperatively control the operation of the processing gas supply and the processing gas exhaust to generate an oxygen content of less than about 100 ppm in the interior portion of the processing enclosure during substrate processing.

11. The electroless fluid processing assembly of claim 8, wherein at least one of the electroless activation cell and the electroless deposition cell comprise a heated substrate support member.

12. The electroless fluid processing assembly of claim 11, wherein the heated substrate support member comprises a substantially planar substrate support platen configured to support a substrate for processing, the platen having a plurality of individually controlled heating sources positioned therein.

13. electroless fluid processing assembly of claim 8, wherein at least one of the electroless activation cell and the electroless deposition cell comprise a cooled substrate support member.

14. electroless fluid processing assembly of claim 12, wherein the substrate support platen is positioned facing at least one of the electroless activation and the electroless deposition cells, such that a substrate supported on the platen is supported in a face-down configuration.

15. A fluid processing platform, comprising:

a mainframe having a substrate transfer robot positioned thereon;

at least one substrate cleaning cell positioned on the mainframe; and at least one processing enclosure positioned on the mainframe, the processing enclosure comprising:

a gas supply positioned in fluid communication with an interior of the processing enclosure;

a first fluid processing cell positioned in the interior of the processing enclosure;

a first head assembly positioned to support a substrate for processing in the first fluid processing cell;

a second fluid processing cell positioned in the interior of the processing enclosure;

a second head assembly positioned to support a substrate for processing in the second fluid processing cell; and a substrate shuffle positioned between the first and second fluid processing cells and being configured to transfer substrates between the fluid processing cells and the substrate transfer robot of the mainframe, wherein an access port is formed through a wall of the processing enclosure and is configured to provide access between the substrate transfer robot of the mainframe and the interior of the processing enclosure.

16. The fluid processing platform of claim 15, wherein the first fluid processing cell comprises an activation cell.

17. The fluid processing platform of claim 16, wherein the second fluid processing cell comprises an electroless deposition cell.

18. The fluid processing platform of claim 15, wherein the first and second head assemblies comprise:

a substantially planar substrate support surface;

a seal circumscribing the support surface;

a plurality of vacuum apertures formed into the support surface; and an actuator assembly configured to vertically, horizontally, and rotationally actuate the substrate support surface.

19. The fluid processing platform of claim 15, wherein the first head assembly comprises a heated substrate support member.

20. The fluid processing platform of claim 19, further comprising at least one individually controlled resistive heater band positioned in the substrate support member.

21. The fluid processing platform of claim 15, wherein the first and second fluid processing cells comprise:

a cell body having a substantially planar fluid basin positioned therein;

a weir surrounding the fluid basin, the weir having a height of between about 2 mm and about 20 mm; and a plurality of fluid apertures formed into the fluid basin, the apertures being in fluid communication with a processing fluid source.

22. A fluid deposition system for semiconductor processing, comprising:

a mainframe having a substrate transfer robot positioned thereon; and at least two substrate processing enclosures positioned on the mainframe and accessible to the substrate transfer robot via an access port formed through a wall of the corresponding substrate processing enclosure, each of the substrate processing enclosures having at least one substrate fluid processing cell positioned therein;

wherein the at least one substrate fluid processing cell comprises an electroless fluid activation cell and an electroless fluid deposition cell positioned adjacent each other in the substrate processing enclosure, the electroless fluid activation cell and the electroless fluid deposition cell each comprise a substrate support member configured to support a substrate during fluid processing in the respective cells, the substrate support member having a temperature control assembly therein, the temperature control assembly comprises a plurality of individually controlled heating elements positioned in the substrate support member, the electroless fluid activation cell and an electroless fluid deposition cell each comprises a processing fluid basin having a fluid retention weir surrounding the processing fluid basin and at least one processing fluid supply aperture positioned on the processing fluid basin, the processing fluid supply aperture being in fluid communication with a processing fluid source.

23. The fluid deposition system of claim 22, wherein the substrate support member further comprises a substrate support surface positioned facing the fluid basin such that a substrate supported thereon is processed in a face-down configuration.

* * * * *

UNITED STATES PATENT AND TRADEMARK OFFICE
CERTIFICATE OF CORRECTION

PATENT NO. : 7,341,633 B2  
APPLICATION NO. : 10/965220  
DATED : March 11, 2008  
INVENTOR(S) : Lubomirsky et al.

Page 1 of 1

It is certified that error appears in the above-identified patent and that said Letters Patent is hereby corrected as shown below:

Column 4, Line 25, please delete "150".

In the Claims:

Column 19, Claim 13, Line 31, please insert --The-- before electroless;

Column 19, Claim 14, Line 35, please insert --The-- before electroless.

Signed and Sealed this

Fifteenth Day of July, 2008

JON W. DUDAS  
*Director of the United States Patent and Trademark Office*